United States Patent
Kritt

(10) Patent No.: US 7,013,231 B2
(45) Date of Patent: Mar. 14, 2006

(54) METHOD AND PROGRAM PRODUCT TO OPTIMIZE MANUFACTURING TEST TIME OF ELECTRICAL DEVICES

(75) Inventor: Barry Alan Kritt, Creedmoor, NC (US)

(73) Assignee: International Business Machines Corporation, Armonk, NY (US)

( * ) Notice: Subject to any disclaimer, the term of this patent is extended or adjusted under 35 U.S.C. 154(b) by 491 days.

(21) Appl. No.: 10/167,145

(22) Filed: Jun. 11, 2002

(65) Prior Publication Data
US 2003/0229465 A1 Dec. 11, 2003

(51) Int. Cl.
*G01R 27/28* (2006.01)
*G01B 5/28* (2006.01)
(52) U.S. Cl. .............. 702/118; 702/35; 702/36
(58) Field of Classification Search ........... 702/118, 702/113, 121, 33, 34, 35, 36
See application file for complete search history.

(56) References Cited

U.S. PATENT DOCUMENTS

| 4,907,700 A | * | 3/1990 | Bankuty et al. ............ 209/546 |
| 5,539,652 A | | 7/1996 | Tegethoff .................... 364/490 |
| 5,623,499 A | | 4/1997 | Ko et al. .................... 371/22.1 |
| 5,684,946 A | | 11/1997 | Ellis et al. ............. 395/183.09 |
| 5,761,408 A | | 6/1998 | Kolawa et al. ......... 395/183.14 |
| 5,918,037 A | | 6/1999 | Tremblay et al. ...... 395/500.03 |
| 6,070,261 A | | 5/2000 | Tamarapalli et al. ........ 714/733 |
| 6,085,346 A | | 7/2000 | Lepejian et al. ............ 714/733 |
| 6,167,545 A | | 12/2000 | Statovici et al. ............ 714/724 |
| 6,710,893 B1 | * | 3/2004 | Hou et al. ................. 358/1.15 |

FOREIGN PATENT DOCUMENTS

JP 5313881 11/1993

OTHER PUBLICATIONS

IBM Technical Disclosure Bulletin vol. 19, No. 6. Nov. 1976, "Relating Logic Design to Physical Geometry in LSI Chip".

* cited by examiner

*Primary Examiner*—Bryan Bui
*Assistant Examiner*—Meagan S Walling
(74) *Attorney, Agent, or Firm*—Jeanine S. Ray-Yarletts

(57) ABSTRACT

A test methodology for use in a manufacturing process includes generating a test management matrix having a plurality of selectable test sites. Each test site indicates the optimum level of tests to be exercised on devices used to manufacture a product, such as a personal computer. Each test site is accessed through the intersection of inputs relating to aggregate test levels and quality of components used in the device. The tests identified at a selected test site are exercised to test the device.

13 Claims, 2 Drawing Sheets

METHOD AND PROGRAM PRODUCT TO OPTIMIZE MANUFACTURING TEST TIME OF ELECTRICAL DEVICES

BACKGROUND OF THE INVENTION

1) Field of the Invention

The present invention relates to testing of electrical machines in general and more particularly to methodology to select the optimum levels of test to use in testing said electrical machines.

2) Prior Art

The testing of manufactured devices to ensure that they meet a desired standard is an integral part of most, if not all, manufacturing processes. The conventional manufacturing process revolves relative to an assembly line along which components or parts are provided and assembled by robots or humans into a specific device such as a computer, printer, etc. The assembled devices are then tested and shipped if the tests show the devices meet a desired specification or reworked if the tests show otherwise.

One of the goals of the manufacturing process is to minimize manufacturing costs so as to keep the device cost competitive and possibly below the cost of products from competing manufacturers. It is often said the low cost manufacturer will capture market share from other manufacturers. As a consequence the competition is fierce to keep manufacturing cost at the lowest possible level.

One of the components of manufacturing costs is the cost associated with testing. It is recognized that the fewer number of test executed on a machine the less time the machine has to be retained on the manufacturing line and the lower will be the test cost for testing. Conversely, the higher the number of tests executed on the machine the longer it has to be retained on the manufacturing line and the manufacturing cost will be higher.

Because testing is used to eliminate poor quality or defective devices from the product stream, it is recognized testing has to be done at a sufficiently high level to root out defective devices. Failure to eliminate defective devices from the product line may result in increased warranty cost and/or customer dissatisfaction. As discussed above testing impacts manufacturing test time which impacts manufacturing costs. Stated another way, the test level selected influences manufacturing test time, product quality and customer satisfaction.

Several test level solutions are provided in the prior art. All are fixed and not adjustable. In one test level solution termed "full test" the test/tests applied is/are such that the maximum test time allotted is exhausted. This is not a desirable solution because it results in lower manufacturing capacity and increases the need for additional space and facilities. In addition, the facilities are also underutilized during non-manufacturing peak period (details discussed hereinafter). The solution is also costly since the test time is always maximum.

In another solution termed "minimal test" the test/tests applied is/are such that the minimum test time allotted is exhausted. Even though this solution results in quicker testing, it could also result in poor quality product which could lead to customer dissatisfaction and higher warranty repair costs. The facilities are also underutilized during non-peak manufacturing periods since additional tests are not done.

In still another solution termed "partial test" sufficient tests are run for a period of time less than maximum allotted time and more than the minimum allotted time. This solution generally provides a better cost/benefit than either of the above solutions, but it ends up under-testing the parts that may have poorer quality levels, and over-tests parts that may not need as much testing. In addition, if partial testing levels are set based on historical quality performance, there is an exposure that a commodity that has had a premium performance history could be affected by a new quality problem that would be undetected because only a reduced test is being performed. The facilities are also being underutilized during non-peak periods since additional testing could be taking place for failure screening and data collection purposes.

In view of the above there is a need to provide a more efficient test solution for testing devices, such as computers, that minimizes the time and expenses presently required and at the same time not compromising product quality.

SUMMARY OF THE INVENTION

The test solution according to the teachings of the present invention maintains a balance between manufacturing test time which influence manufacturing cost and test escapes which influence product quality, warranty cost and customer satisfaction.

The test solution includes the generation of a test management matrix having a plurality of selectable test sites. Each test site relates to an optimum level of tests to be exercised on a particular type of device. Each test site is accessed through the intersection of inputs relating to aggregate test levels (discussed hereinafter) and quality of components used in the device. The test associated with a selected test site is executed on the device.

This invention describes a simplified approach to optimize the balance between reducing testing and maintaining a premium quality level. The approach varies the testing level dynamically and automatically, with a simple set of inputs controlled by the appropriate manufacturing and quality representatives. The methodology takes into account the variability of the cost of testing during peak/off-peak times, the importance of collecting the maximum amount of sample data, the variability of quality levels between different commodity levels, and the savings of screening defects before they generate service calls. The net result is greater manufacturing throughput using the same buildings and facilities with the same or better overall product quality levels.

BRIEF DESCRIPTION OF THE DRAWINGS

The advantages associated with the present invention will be more clearly understood hereinafter as a result of a detailed description of a preferred embodiment of the invention when taken in conjunction with the following drawings.

DETAILED DESCRIPTION OF THE PREFERRED EMBODIMENT

In many manufacturing environments there is a large amount of variability in the production volumes on a day to day basis. Manufacturing buildings and equipment are constructed to meet the capacity needed during the peak production periods. Production rates during the end of fiscal quarters and the end of the fiscal year are generally higher than other, off peak, times. During the peak production periods, every minute of test can result in lower maximum throughput. Conversely, during the off peak times testing can be performed for an extended time without impacting the throughput (therefore at very little incremental cost). This low cost testing can be used to perform additional screens for quality defects (using more complex and time consuming algorithms) and to collect statistical data on failures (especially failures that require more time consuming tests to detect) to enable controlled reduced testing during the peak manufacturing periods. Note that the additional testing performed during the off peak period would produce a quality level that surpasses the target average quality levels. This would build a "quality surplus" that would more than offset any effects of the controlled test coverage decrease during the reduced testing periods.

It would therefore be desirable to vary the level of aggregate testing to correspond with the desired production rate. It would also be desirable to have a quick and simple way of allowing manufacturing (MFG) to be able to control this aggregate testing level without requiring an engineering analysis and authorization. This can be achieved by creating several aggregate test levels as done in FIG. 1 Block 10, and having some predetermined requirements on the frequency/duration that reduced testing can be used. These predetermined requirements would be set by a quality or engineering organization to ensure sufficient testing is being performed during off peak periods and that the required statistical data is being collected to allow reduced testing during the peak manufacturing periods.

Figure 1:
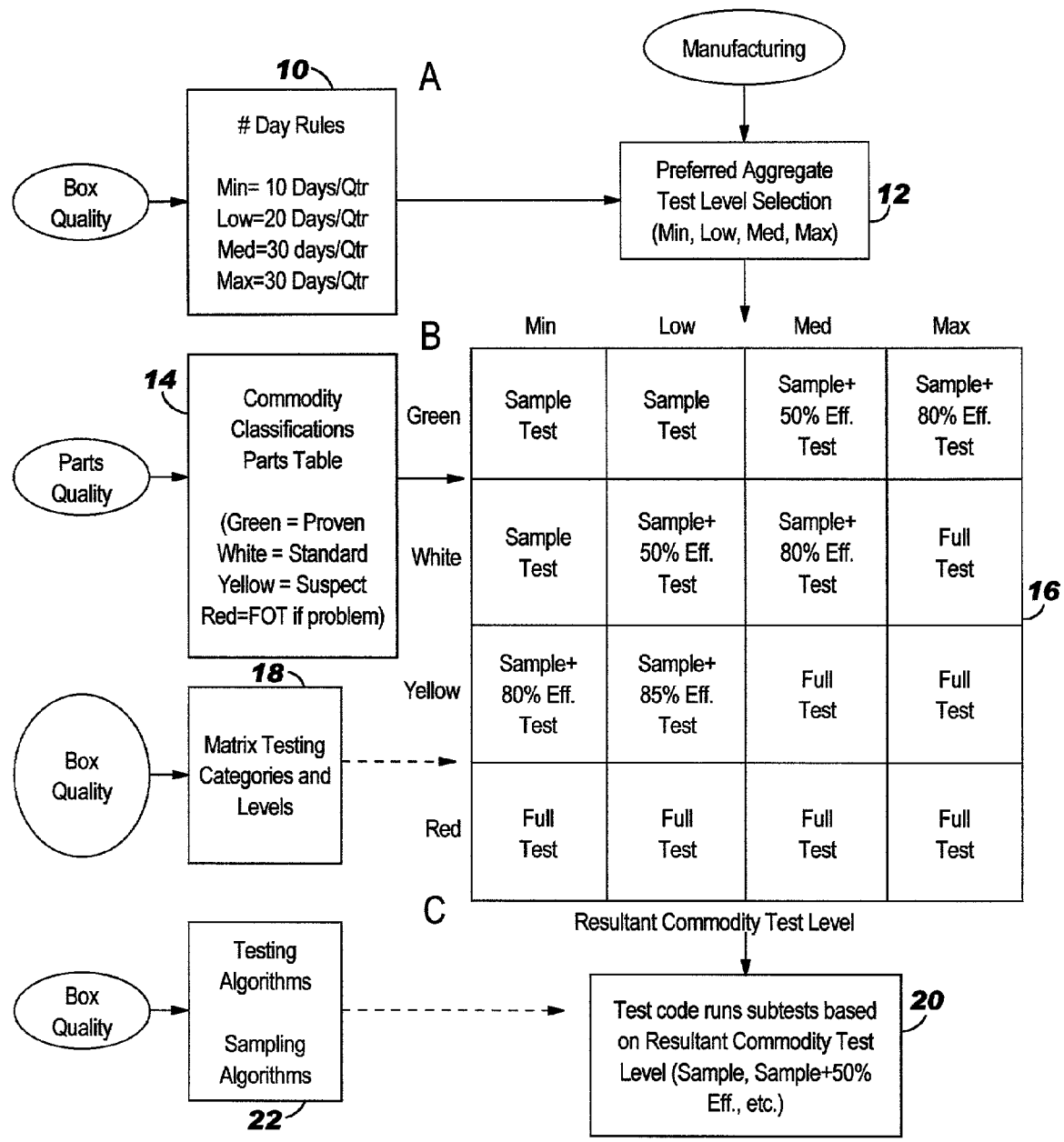
FIG. 1 represents a logical flowchart of the test solution according to the teachings of the present invention.

FIG. 1 shows a block diagram of a methodology that optimizes the tests required to be run on machines to ensure the machines meet a desired quality level. The methodology is partitioned into sections A, B and C. In section A the methodology determines the preferred aggregate test level to run on a particular machine. Section A of the methodology includes Number of Day Rules Block 10 and Preferred Aggregate Test Level Selection Block 12. The input into Block 12 is from manufacturing and the input into Block 10 is from Box Quality. Stated another way, Manufacturing influences test level selection whereas Number (#) of Day Rule is influenced by Box Quality. Manufacturing as used in this application relates to the manufacturing personnel whereas Box Quality relates to the appropriate engineering personnel. The product is referred to as a box.

Manufacturing's inclination would be to just keep the level of testing set to minimum even during the off peak production times. This would prevent the build up of the "quality surplus" and the collection of the data required to determine the acceptability of reducing testing during the true peak production times. To control the usage of the different testing levels, a "Number of Days Rule" Matrix is used. The Number of Days Rule Matrix shows the number of days per quarter (or any other time frequency), that Manufacturing can use the various levels of testing; so Manufacturing can budget their test times according to anticipated peak manufacturing periods. This Number of Days Rule Matrix is set by the team that will be analyzing the failure data to ensure the required amount of data will be collected to provide statistically significant decisions. This provides a quick and simple way for manufacturing to have considerable influence over the aggregate testing level, yet provide the control required to ensure quality objectives are met.

Still referring to FIG. 1 the Number of Day Rules Block 10 partitions a test period for example a quarter (Qtr) into days and specifies the level of testing that can be run for the number of days in that particular quarter. For example, in Block 10 for 10 days in the quarter the minimum tests can be run. The tests/days relationship is recorded in Block 10 as Min=10 Days/Qtr. Similarly, for 20 days in the quarter a low number of tests can be run and so forth. The output from Block 10 controls the number of days that manufacturing can select a particular test level. In Block 12 the available tests level are minimum, low, medium and maximum. Manufacturing is permitted to select one of those test levels and use it for the number of days (within a specific time period) as specified by Block 10. Based upon the test level selected by Manufacturing and the number of days rule a test level is outputted from Block 12. The output can be minimum, low, medium or maximum. Section A shows that MFG personnel can control the aggregate level of testing to be performed for that day in manufacturing. This invention describes 4 levels of testing (1=minimum, 2=low, 3=medium, 4=maximum). However, the level of granularity could be increased or decreased.

One potential problem with reducing the amount of aggregate testing during peak manufacturing periods is that there may be specific commodities (parts) used that are known to have a high failure rate. Reducing the test of these parts would be detrimental since it would significantly affect the outgoing quality levels, and increasing warranty costs and customer dissatisfaction. As a result, there are some parts that should have additional testing, even to the point of doing 100% testing regardless of the manufacturing test time constraints.

On the other extreme, there may be some commodities that have been in use for an extended period of time with a very minimal failure rate. In these cases, the time and cost of doing additional testing would not be cost justified, except for the purpose of ensuring that the part has not been affected by some unusual change by the supplier (for instance a process change or part change) that causes the failure level to exceed historical levels.

There is also another testing option available which is to do a partial test. Since test time and test coverage are frequently nonlinear (i.e. it may be possible to test for 50% of the defects in 10% of the test time required to do a full screen, or 80% of the defects in 20% of the full test time, or 95% of the defects in 60% of the full test time, and 100% of the defects using the full test time). As a result there is a significant time/cost savings to use a partial test when possible, and even a small reduction in test coverage can provide a big savings.

As a result, the amount of testing that will be performed on a specific commodity needs to be determined not only by the aggregate test level, but also by the anticipated or historical quality level for the specific commodity. This can be difficult to do since commodity quality levels can vary anywhere within the range of 0–100%. This invention simplifies the problem by categorizing the commodity quality levels into several quality classifications. The example used above shows the classifications of Green, White, Yellow and Red (although other numbers or types of classifications could also be used). The White classification could be used as a default quality level for new or standard quality parts and would not require any inputs to be made to the "Commodity Classification Parts Table" (Block 14, FIG. 1), greatly simplifying the data entry effort. The Red classification could be used for parts that have known quality problems (or are part of a First Off Test (FOT) qualification), or for some other reason require a full test. Green could be used for parts that have a superior historic quality level. Yellow could be used for parts that are suspect for some reason (such as a previous quality problems that may have had the root cause fixed, or a new parts vendor being used, etc.).

Combining the preferred aggregate test levels with the commodity quality categorization will determine the resulting test level based on a decision matrix such as 16. The resulting test level in the decision matrix will control the amount of testing that will be done on that commodity on that particular day. The sample resulting test levels shown in the example are Sample, Sample+50% Screen, Sample+80%Screen, Sample+95%Screen, and Full).

Still referring to FIG. 1, section B of the methodology comprises Block 14 which has to do with commodity classification based upon quality of parts and the merging of the preferred aggregate test levels with specific commodity quality information. Regarding commodity classification the parts are grouped, based upon their quality, into four groups labeled Green, White, Yellow and Red. It should be noted other color classification could be used without departing from teachings of the present invention. The part quality designation and the preferred aggregate test level are used to generate the level of testing that will be done on a particular machine. The level of tests is selected from a matrix 16 which lists a plurality of sites and for each site the level of testing to be run.

In FIG. 1, the example provides a 4×4 matrix with a total of 16 sites. Each site lists the number of tests to run on a particular machine. For example, if the manufacturer selects the minimum test level selection and the parts quality was green then the test site 56 labeled Sample Test would be executed and so forth. In other words, the site which is selected from matrix 16 is based upon parts quality and the preferred aggregate level test selected by Manufacturing. The intersection of the two variables identifies the level of testing that is run on a particular machine.

Matrix 16 shows four possible aggregate levels of tests (Min, Low, Med, Max), four possible commodity quality levels (Green, White, Yellow, Red), and five possible resultant commodity test categories (Sample, Sample+50% effectiveness, etc.) The number of categories and levels that are used by a particular manufacturer are determined by Box Quality and used to create matrix 16. The definition of the appropriate number/classification of aggregate test levels, commodity quality levels, and resultant commodity test categories is shown as block 18.

In Section C of the methodology the resultant commodity test level, an output from matrix 16, is then executed on the machine Block 20 based upon the input of the testing algorithm from Block 22. In other words, in Section C of the methodology the resultant test levels control the diagnostic testing of the box. The test programs need to be dynamically configurable to allow differing testing levels. The engineer knowledgeable in a particular commodity needs to determine the types of defects that historically have occurred, and the type of sub-tests that are required to detect these defect types. The sub-tests can be either a reduction in the types of tests and/or a reduction in the sample used during the test.

For example, to perform a Sample test the memory diagnostic may perform a test using only 2 simple patterns on 5% of the memory locations; the Sample+50% screen may include 4 simple patterns on 100% of the memory locations, the Sample+80% could additionally use 2 more complex patterns on 100% of the memory, etc. As mentioned above, the significance of these test levels is the nonlinear relationship between test time and test coverage.

The diagnostic tests need to be written in a way to allow dynamic control over the sub-tests that will be run. This requirement can be simplified by picking several discrete test levels such as those shown in the sample matrix (i.e. Sample, Sample+50% screen, Sample+80%screen, etc.), and the sub-tests that have been identified to run as a result of these required quality screening levels.

Block 22 represents the input (as described above) which will determine the relationship between a resultant commodity test level for a particular part, and the quantity and duration of testing needed to achieve the desired commodity test level.

Figure 2:
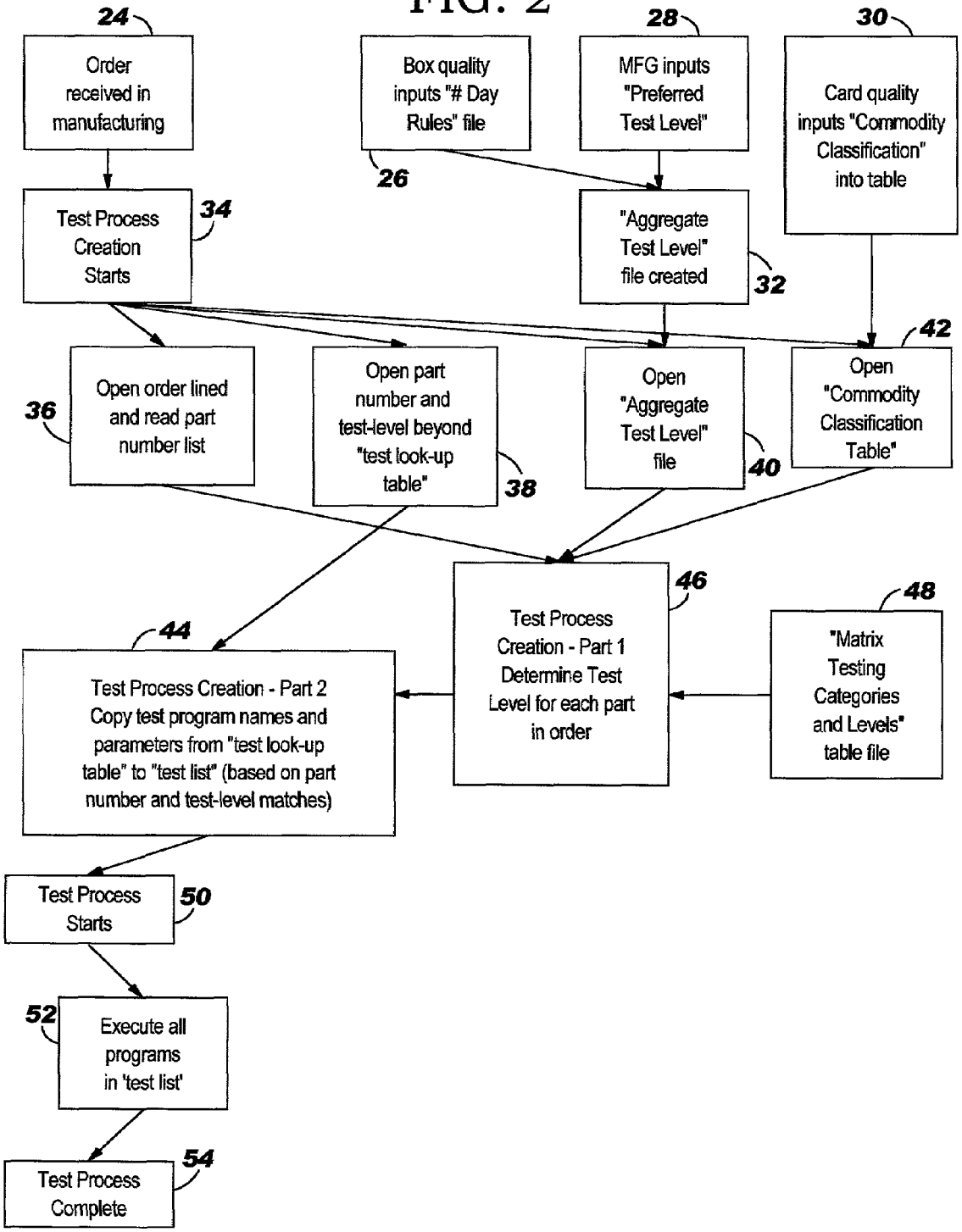
FIG. 2 shows a flowchart of a typical implementation of the invention using the methodology of FIG. 1.

FIG. 2 shows a flowchart of a test implementing the methodology shown in FIG. 1. The flowchart includes Block 24 through Block 54. In Block 24 an order to build machine is received at the manufacturing line. The process then enters Block 34 where the test process creation starts. Blocks 26, 28, 30 and 32 identify inputs previously described. The inputs include # of Day Rule file, Preferred Aggregate Test Level Selection File, Commodity classification and Matrix Testing Categories and Levels.

The "# of Day Rules" (Block 26) are used to verify the "Preferred Aggregate Test Level" selection is valid. If so, the "Aggregate Test Level" file (Block 32) is created for the current day, and it has one of the predefined test levels (i.e. Min, Low, Med, Max) as it's contents.

Test Process Creation (Block 46)—Part 1 (Determining the Test Level for every part used in the order).

Every part number in the order is used to index into the "Commodity Classification" table (Block 42) (which has a classification such as Green, White, Yellow, Red for each part number). Based on the Commodity Classification and the Aggregate Test Level (from above), the appropriate test level (as defined in the "Matrix Testing Categories and Levels" file Block 48) is identified for each part. The output of this step is a file containing every part number in the order and it's test level. For example:

| Part Number | Test Level |
| --- | --- |
| 1111111 | Sample |
| 2222222 | Sample + 50% Efficiency |
| etc. | |

The test lookup table is keyed by both part numbers and the test level, and contains the names of the test program(s) and associated parameters for the part number/test level.

For Example:

| Part Number | Test Level | Description | Test Program | Parameters |
| --- | --- | --- | --- | --- |
| 1111111 | Sample | Main System Board - Type 1 | test1.exe | /runtest=sample |
| 1111111 | Sample + 50% Efficiency | Main System Board - Type 1 | test1.exe test9.exe | /runtest=sample50 /partial1 |

-continued

| Part Number | Test Level | Description | Test Program | Parameters |
|---|---|---|---|---|
| 1111111 | Sample + 80% Efficiency | Main System Board - Type 1 | test1.exe test9.exe | /runtest=sampe80 /partial2 |
| 1111111 | Sample + 95% Efficiency | Main System Board - Type 1 | test1.exe test9.exe | /runtest=sample95 /partial3 |
| 1111111 | Full | Main System Board - Type 1 | test1.exe test9.exe | /runtest=all /fulltest |
| 1111888 | Sample | Main System Board - Type 2 | test5.exe | /mintest |
| 1111888 etc. | Sample + 50% Efficiency | Main System Board - Type 2 | test5.exe | /mintest |

The Test Process Creation—Part 2 uses the Part Number/Test Level input file (from Part 1) and then finds the matching Part Number/Test Levels in the Test Lookup file. A list of test programs (and their parameters) is created based on the matching part numbers/test levels. For instance if the order uses the system board 1111111 with the test level Sample+50%, the test programs test1..exe (with the/runtest=sample50 parameter) and test9.exe (with the/partial1 parameter) will be added to the list of programs to run. This test programs in the "test list" created during this "test process creation step" will then be executed during the manufacturing process. (Block 52)

The described methodology and implementation is a simple to use process to optimize the balance between reducing testing and maintaining a premium quality level. The approach varies the testing level dynamically and automatically with a simple set of inputs controlled by the appropriate manufacturing and quality representatives. The methodology takes into account the variability of the cost of testing during peak/off-peak times, the importance of collecting the maximum amount of sample data, the variability of quality levels between different commodity levels, and the savings of screening defects before they generate service calls.

The advantages of this solution are:
1) The manufacturing testing space is being used in an optimal manner, reducing the need for additional buildings and facilities. The capacity during peak periods is increased since the aggregate testing level is variable and can be reduced using supporting statistical data. The non-peak periods are used to run extended testing to capture statistical data, and screen additional failures to build a "quality surplus" to more than offset any effects of reducing the test levels during the peak periods.
2) Testing levels are optimized for individual commodities based on historical/projected quality levels. Instead of using one level of testing for all the parts in a given category, the testing level is optimized based on historical quality (based on data captured during the off-peak times) or based on other criteria such as new parts qualifications. Testing can more fully take advantage of the nonlinear characteristics of test coverage and test time based on the data that has been collected (by using an optimized subset of the tests).
3) The system is simple to understand and use which means it is more likely to be used. By allowing several teams the ability to pick from a small, fixed set of choices (such as Daily Test Level, and Commodity Quality Categories) relating to their areas of responsibility, the system can substantially capture the benefits of varying test levels with a minimum amount of effort or knowledge. The users only have to make selections based on their expertise (i.e.

manufacturing does not have to know about commodity quality levels, or test algorithms, just what Daily Test Level they want to use. Likewise, the parts quality engineer does not need to be concerned with manufacturing capacity concerns or required box quality levels, only the historic quality level of the parts they are responsible for, and for defining testing algorithms that will be used for testing, etc.)

In addition, the present invention (1) allows variations in aggregate testing levels of machines (built from multiple commodities) based on daily manufacturing throughput requirements, (2) predefines the amount/quality of daily aggregate testing level variations that can be selected by manufacturing over a period such as a month/quarter such that manufacturing can budget/plan the variable testing levels, (3) predefines commodity quality levels into quality classification based on historical/projected quality levels, (4) uses a simple matrix model to map aggregate testing levels and commodity quality levels into a small number of possible testing levels to simplify test selection, and (5) controls the cost/quality level using predefined (Number of Day Rules) to ensure off-peak production times will be used to provide additional testing statistics, data collection, and to build quality surpluses thus enabling reduced testing during the on-peak production times.

What is claimed is:
1. Method comprising:
 (a) generating a test management matrix containing a plurality of locations with each location identifying at least one test to be executed in testing operability of devices in electrical machines;
 the test management matrix including:
 a 4×4 matrix with 16 locations;
 four possible aggregate levels of tests;
 four possible commodity quality levels; and
 five possible resultant commodity test categories
 (b) selecting at least one of the locations;
 (c) executing the at least one test on the devices to check the operability of said devices; and
 (d) shipping machines that pass the at least one test and not shipping machines that failed said at least one test.
2. The method of claim 1 wherein the aggregate levels of tests include Min, Low, Med and Max.
3. The method of claim 1 wherein commodity quality levels include levels green, white, yellow and red.
4. Method comprising:
 (a) generating a test management matrix containing a plurality of locations with each location identifying at least one test to be executed in testing operability of devices in electrical machines;
 (b) selecting at least one of the locations;

(c) providing, as inputs to said test management matrix, preferred aggregate test levels and characteristics associated with qualities of parts used to manufacture said machines, the characteristics including green, white, yellow and red; and
(d) executing the at least one test on the devices to check the operability of said devices.

5. Method comprising:
(a) generating a test management matrix containing a plurality of locations with each location identifying at least one test to be executed in testing operability of devices in electrical machines;
(b) selecting at least one of the locations;
(c) providing, as inputs to said test management matrix, preferred aggregate test levels and characteristics associated with qualities of parts used to manufacture said machines;
(d) the selecting step further including:
selecting one of the preferred aggregate test levels;
selecting one of the characteristics; and
selecting the at least one location at a point whereat the selected preferred aggregate test levels and selected one of the characteristics intersect; and
(d) executing the at least one test on the devices to check the operability.

6. Method comprising:
(a) generating a test management matrix containing a plurality of locations with each location identifying at least one test to be executed in testing operability of devices in electrical machines;
(b) selecting at least one of the locations;
(c) the selecting step including:
selecting a preferred aggregate test level;
selecting a characteristic representing quality of parts used to manufacture said devices;
plotting on the test management matrix the selected preferred aggregate test level and the selected characteristic; and
selecting said at least one location at the intersection of said selected preferred aggregate test level and said selected characteristic; and
(d) executing the at least one test on the devices to check the operability of said devices.

7. The method of claim 6 wherein the preferred aggregate test level includes minimum, low, medium and high.

8. The method of claim 6 wherein the characteristics for parts quality are color coded.

9. The method of claim 8 wherein the color code includes green, white, yellow, red.

10. A method for testing machines including the acts of:
(a) providing a test management matrix with locations indicating tests to be executed;
(b) partitioning a manufacturing period into multiple sub-periods;
(c) for each sub-period permitting execution of a predefined test level;
($c_1$) classifying parts based upon quality;
(d) selecting one of the predefined test levels; and
(e) using parts quality classification and selected predefined test level to select a location in said test management matrix.

11. The method of claim 10 further including the acts of executing test at the selected location to test said machines.

12. A program product including:
a media on which computer program is recorded, said computer program including a code set that provides a test management matrix with locations identifying tests to be executed on a product under test;
a code set that partitioned a predefined period into multiple sub-periods;
a code set that associates a sub-period with predefined test level;
a code set that classifies parts based upon quality;
a code set to select one of the predefined test levels; and
a code set that uses a selected predefined test level and parts quality classification to select a location in the test management matrix.

13. The program product of claim 12 further including a code set that executes at least one test identified at the location to test a system.

* * * * *